United States Patent [19]

Laskowski et al.

[11] Patent Number: 4,613,417
[45] Date of Patent: Sep. 23, 1986

[54] SEMICONDUCTOR ETCHING PROCESS

[75] Inventors: Edward J. Laskowski, Scotch Plains; Catherine Wolowodiuk, Chatham Township, Morris County, both of N.J.

[73] Assignee: AT&T Bell Laboratories, Murray Hill, N.J.

[21] Appl. No.: 687,129

[22] Filed: Dec. 28, 1984

[51] Int. Cl.[4] .................................................. C25F 3/12
[52] U.S. Cl. .............................. 204/129.85; 204/129.95
[58] Field of Search ...................... 204/129.75, 129.85, 204/129.95

[56] References Cited

U.S. PATENT DOCUMENTS

| | | | |
|---|---|---|---|
| 4,389,291 | 6/1983 | Kohl et al. | 204/129.3 |
| 4,404,072 | 9/1983 | Kohl et al. | 204/129.3 |
| 4,414,066 | 11/1983 | Forrest et al. | 204/129.3 |
| 4,415,414 | 11/1983 | Burton et al. | 204/129.3 |
| 4,482,443 | 11/1984 | Bacon et al. | 204/129.3 |

Primary Examiner—T. M. Tufariello
Attorney, Agent, or Firm—Walter G. Nilsen

[57] ABSTRACT

A photoelectrochemical etching process is described for n-type and semi-insulating III-V semiconductor compounds that contain aluminum or indium (AlGaAs, InGaAs) in which a non-aqueous electrolyte is used. High etch rates are achieved without harm to exposed metallization or p-layers. An exemplary application is the separation of chips (e.g., LED chips) after wafer processing.

17 Claims, 4 Drawing Figures

SEMICONDUCTOR ETCHING PROCESS

TECHNICAL FIELD

The invention is a photoelectrochemical procedure for etching III–V semiconductor compounds containing aluminum and indium.

BACKGROUND OF THE INVENTION

Great advancements have been made in semiconductor technology in the last few years largely due to the discovery of new materials and the discovery of new methods of making better materials. These advances have led to new device applications for semiconducting materials and such applications often require different fabrication techniques. Typically, these techniques are aimed toward obtaining smaller size, more precise location of various geometrical features in the device, more accurate shapes for various geometrical features in the structure, greater adherence of metallic substances to the semiconductor surfaces, etc.

A particular case in point is the development of semiconductor devices involving III–V compounds containing aluminum or indium. Exemplatory compounds are GaAlAs, InGaAs, AlInAs, InGaAsP and InGaAlAs. These III–V compounds usually appear in the form of layers or thin films lattice matched or nearly lattice matched to various substrates such as GaAs and InP. Inclusion of Al or In is usually done to change optical wavelengths or permit lattice matching to the substrate. Typical devices are photodetectors, light-emitting diodes and semiconductor lasers. Generally, such devices operate at longer wavelengths than traditional III–V devices. Typical wavelengths for such devices are in the range from 0.8 $\mu$m to 2.0 $\mu$m, most particularly around 1.3 $\mu$m.

In fabricating such devices, it would be highly advantageous to have an etching procedure which can be controlled as to etch rate, area to be etched and geometrical shape to be etched. Such an etching procedure is usually referred to as an anisotropic etching procedure. Such a procedure would be useful for making channels, via holes, mirrors, lenses, diffraction gratings and in the separation of individual chips on a semiconductor wafer.

Photoelectrochemical etching is particularly attractive as an anisotropic etching procedure. This procedure has been discussed in a number of references including U.S. Pat. No. 4,482,443 issued Nov. 13, 1984 to D. E. Bacon et al; U.S. Pat. No. 4,389,291 issued June 21, 1983 to P. A. Kohl et al; U.S. Pat. No. 4,404,072 issued Sept. 13, 1983 to P. A. Kohl et al; and U.S. Pat. No. 4,414,066 issued Nov. 8, 1983 to S. R. Forrest et al.

It is highly advantageous to develop a high speed accurate procedure for etching aluminum and indium containing III–V compounds by photoelectrochemical etching procedure.

SUMMARY OF THE INVENTION

The invention is a process for photoelectrochemically etching n-type and intrinsic III–V semiconductor compounds containing aluminum or indium in which a nonaqueous electrolyte is used.

A large variety of nonaqueous electrolyte systems are useful in the practice of the invention. Generally, water content should be kept below 10 weight percent, preferably 5 weight percent or most preferably 1 weight percent. The solvent preferably comprises one or more organic polar liquid which is electrochemically stable and permits the desired etching process to take place. Typical solvents are alcohols (including glycols) with up to 10 carbon atoms with methanol, ethanol and propanol preferred. Acetonitrile is also useful. Methanol is most preferred. Included in the electrolyte are one or more substances to increase the conductivity of the electrolyte. Any substance that increases conductivity is useful. Generally substances that dissolve in the nonaqueous solvent and for ionic species in the nonaqueous solvent are most useful. Naturally, such substances should not react with or degrade other components (e.g., solvents, etc.) of the electrolyte. Typical substances are various acids such as HCl, $H_2SO_4$, phosphoric acid, HF, tetraalkyl ammonium salts such as tetrabutyl ammonium bromide, sodium alkoxy compounds such as sodium methoxide, etc. Combinations of substances such as phosphoric acid and HF are also useful. Particularly good results are obtained with $H_2SO_4$ and HCl (generally 0.1 to 1 molar preferred). These systems yield high etch rates with smoothly etched surfaces. These concentration ranges are preferred because they insure reasonable etch rates without the danger of attack on other parts of the semiconductor device.

DETAILED DESCRIPTION

Figure 1:
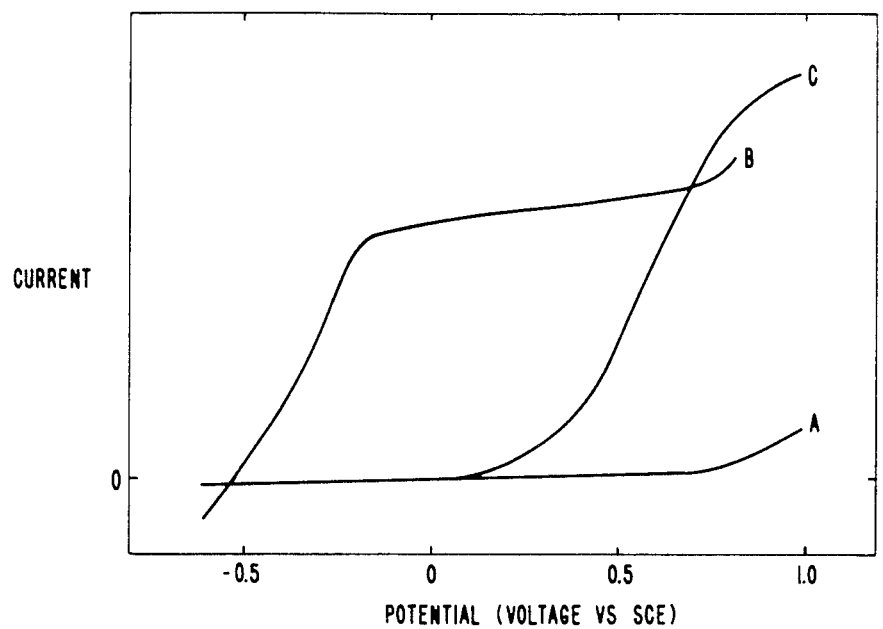
FIG. 1 shows a voltammogram (plot of potential vs. etch rate) for gallium aluminum arsenide.

The invention is based on the discovery that the use of a nonaqueous electrolyte system is highly advantageous in photoelectrochemically etching n-type III–V compound semiconductors containing aluminum and indium. First, it avoids or minimizes formation of a passivating film that retards the photoelectrochemical etching process. It also insures greater selectivity of the photoelectrochemical etching procedure. For example, n-type semiconductor compound etches at a high rate without affecting p-type semiconductor material.

In the electrochemical photoetching process, the semiconductor is made part of an oxidation-reduction reaction. The semiconductor is made the anode and a counter-electrode (usually an inert metal such as platinum or platinized titanium) made the cathode. A potential is applied to the semiconductor, the value of which is discussed below. A standard electrode is often used in the process to measure and monitor the electrode potential. It is believed etching results from a decomposition reaction induced by photogenerated holes at the surface of the semiconductor.

The process is applicable to a wide variety of semiconductor compounds but particularly useful for III–V compound semiconductors containing aluminum or indium. The process is useful for even small amounts of aluminum or indium (as little as 0.5 mole percent) but usually compositions range from 10 to 90 mole percent aluminum or indium (e.g., $Al_{0.1}Ga_{0.9}As$, $Al_{0.9}Ga_{0.1}As$, etc.). Particularly important is aluminum gallium arsenide ($Al_xGa_{1-x}As$) and indium gallium arsenide ($In_xGa_{1-x}As$) with x ranging from 0.1 to 0.6 for aluminum and 0.4 to 0.5 for indium. Also, InAlAs is usefully etched in accordance with the invention as well as AlAs and InAs. Often, these compounds are deposited in the form of films or layers on substrates composed of other substances (e.g., GaAs).

The invention is also useful for quaternary III–V compounds containing aluminum or indium. Typical examples are InGaAsP, InGaAlAs, AlGaPSb, AlGaAsSb, AlInPAs, AlInPSb and AlInAsSb.

The invention is contemplated for both semi-insulating (intrinsic) and n-type compound semiconductors. Generally, doping concentration varies from about $10^{14}$ to $10^{19}$ atoms/$cm^3$ with the lower concentration close to the limit of purity for compound semiconductors. Compensated semi-insulating semiconductors may also be processed in accordance with the invention but p-type material is not etched by the procedure. Indeed, a particular advantage of this procedure is that p-type material in contact with the electrolytic solution during processing is essentially unaffected and n-type material can be removed without removal of the p-type material.

The particular dopants used to make the compound semiconductor n-type is not critical. Typical dopants are Te, Si, S, Se, etc. As stated above, some doping is unintentional and represents impurities that usually make the semiconductor compound n-type.

In this procedure, the surface to be etched is irradiated with light (or radiation) of sufficient energy to generate holes in the valence band of the semiconductor which are available at the interface between semiconductor and electrolytic solution. Generally, this requires radiation with energy equal to or greater than the bandgap of the compound semiconductor but various kinds of impurity states might permit the same results to occur for radiation of slightly lower energy. Either broadband or monochromatic (e.g., lasers) sources may be used. Filters may be used with broadband sources to remove unwanted radiation. Fluorescent sources such as mercury lamps are also useful.

For all practical purposes, etching only takes place in the presence of radiation and the etching rate is proportional to the radiation intensity. Thus, etching is limited to areas of the semiconductor surface where radiation (of the proper energy) is incident on the surface. Also, the nature of the radiation (e.g., ray direction and spatial intensity variation) can be used to obtain various geometrical features on the semiconductor surface. For example, use of collimated light through a mask results in straight-walled geometric features such as holes and slots (see U.S. Pat. No. 4,389,291). Also, judiciously planned intensity variations in the incident radiation give rise to such geometrical features as lenses, etc. (see for example, application Ser. No. 416,473 filed Sept. 10, 1982, now U.S. Pat. No. 4,415,414).

A power source is used to supply the potential to the semiconductor and to drive the oxidation-reduction reaction. Meters are used to measure the potential applied to the semiconductor in terms of a standard cell (usually against a saturated calomel electrode, SCE, also located in the electrolytic solution) and the current. The current is proportional to the etch rate and therefore is a convenient monitor for the etching process.

The potential applied to the semiconductor to be photoetched is particularly important because too high a potential will lead to etching in the absence of radiation, and too low a potential will prevent any etching even in the presence of radiation. As a general criteria, the potential should be between the maximum potential of the valence band of the semiconductor in the particular electrochemical solution being used and the flat band potential under these same conditions. The flat band potential is approximately the conduction band minimum for n-type semiconductors and about halfway between valence and conduction band for intrinsic or semi-insulating semiconductors.

Sometimes these potentials are known but more often must be estimated or measured separately. Typical potentials in methanol-based electrolyte and $Al_{0.3}Ga_{0.7}As$ are in the range from $-0.7$ to 0.5 volts relative to a saturated calomel electrode.

A procedure exists for determining the best applied voltage under a particular set of experimental conditions. This procedure involves taking a voltammogram of the semiconductor under the particular conditions that the etch process is to be carried out. Here, the etching rate is measured by observing the current as described above as a function of applied voltage with and without radiation incident on the surface of the semiconductor. It is found that in one region of potential, high etching (as evidenced by high currents) is observed with radiation but essentially no etching (near zero current) without radiation. It is this region of potential that is of interest in the electrochemical photoetching process.

A typical voltammogram is shown in FIG. 1. These measurements were carried out in an electrolyte system with methanol solvent, phosphoric acid (about 3.5 molar) and tetrabutyl ammonium bromide (0.2 molar).

The sample is n-type $Ga_{0.7}Al_{0.3}As$. The curve labeled "A" represents the current vs. voltage characteristics in the absence of radiation, the curve labeled "B" represents the same characteristics with radiation. The curve labeled "C" shows the same characteristics for p-type material (p-$Ga_{0.7}Al_{0.3}As$) with the same irradiation as in curve "B".

As can be seen from the graph in FIG. 1, there is a potential range (here from about $-0.2$ volts to $+0.1$ volts) where the n-type $Ga_{0.7}Al_{0.3}As$ has a high etch rate in the presence of radiation (curve "B") but essentially zero etch rate without radiation (curve "A") and essentially zero etch rate for p-type $Ga_{0.7}Al_{0.3}As$ being irradiated as in curve "B" (see curve "C"). Similar voltammograms can be measured for other materials using other electrolyte systems. In some electrolyte systems (e.g., propylene carbonate with an oxidizable species to promote conductivity), other electrochemical processes might dominate the etching reaction and usually such systems should be avoided.

Typical potential ranges for $Ga_{0.7}Al_{0.3}As$ and various electrolytes are as follows: phosphoric acid in methanol $-0.4$ to $+0.5$ volts; $H_2SO_4$ in methanol $-0.4$ to $+0.5$ volts; HF in methanol $-0.4$ to $+0.5$ volts; tetrabutyl ammonium bromide $-0.4$ to $+0.5$ volts; HF and tetrabutyl ammonium fluoride in methanol $-0.5$ to $+0.5$ volts and $NaOCH_3$ in methanol $-0.7$ to $+0.3$ volts.

For many applications, a mask is used to confine the radiation (and therefore the etching) to specific regions. Masks may also be used to vary the etching rate over some portion of the semiconductor surface by varying the light transmission over some portion of the surface. Partially reflecting or absorbing masks may be used. Often photographic emulsions are used in making such masks. Light direction in the applied radiation is also significant. For example, parallel rays through a mask can be used to etch features with straight walls such as holes or slots with straight, right-angled walls.

The nature of the electrolytic solution is of great importance in the practice of the invention. The electrolytic solution should be sufficiently conductive to permit the oxidation-reduction reaction to take place (e.g., 0.00001 mho/cm). The main constituent is a non-aqueous solvent, generally a polar organic solvent which is electrochemically stable, dissolves sufficient species to permit reasonable electrical conductivity (at least 0.001 mho/cm preferred) and not interfere with the photoelectrochemical etch reaction. Typical solvents are alcohols (including glycols, glycerines, phenols) with up to 10 carbon atoms, acetonitriles, etc. Generally, the non-aqueous solvent component is the major component in the solution and may be composed of more than one substance. Of importance is the minimization of water contained in the electrolyte. It is preferred that the water content be below 5 weight percent. In addition, it is preferred that the solvent be made up of at least 95 weight percent alcohol and more preferred that the solvent contain less than one weight percent water. The preferred solvent is methanol with less than about 0.5 weight percent water. Other inert materials may be present in the electrolyte provided they do not interfere detrimentally with the electrolytic process.

The optimum concentration of various components in the electrolyte system can vary over large limits depending on the component and solvent system. Typical values for as follows: 0.25 molar for $H_2SO_4$ in methanol, 0.15 molar for HCl in methanol, 0.08 molar p-toluene sulfonic acid in methanol, 0.18 molar for tetrabutyl ammonium bromide in methanol, 3.5 molar for phosphoric acid in methanol, and 3 molar for HF in methanol. It should be recognized that the process works perfectly well both above and below the optimum concentration but at the optimum concentration, there is maximum etch rate without evidence of the formation of a film to retard etching. This is evidenced by either a non-linear effect of increased radiation intensity on etch rate (see FIG. 2) or an anomalous cyclic voltammogram where etching rate is higher on increasing potential than on reducing potential.

Figure 2:
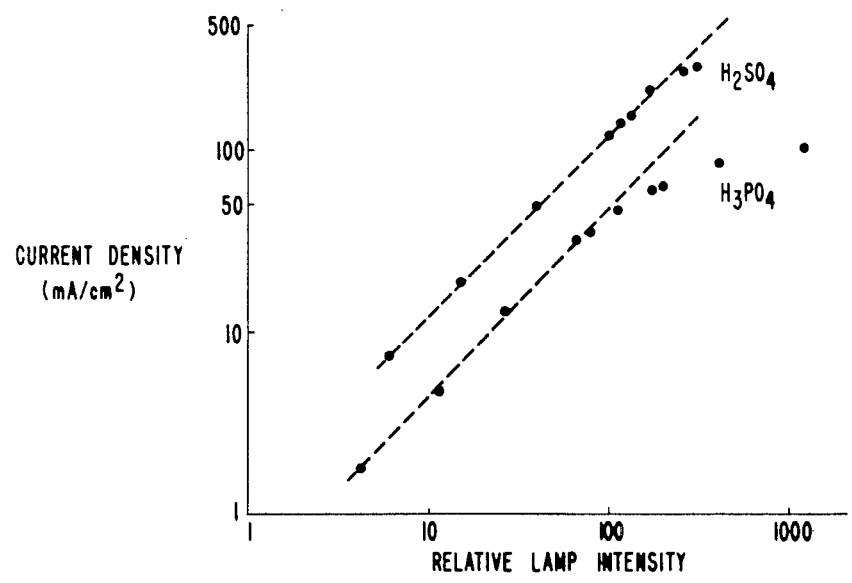
FIG. 2 shows a plot of etch rate vs. illumination intensity for two electrolyte systems, one of phosphoric acid in methanol and one of sulfuric acid in methanol.

FIG. 2 shows data on etch rate as a function of lamp intensity for two electrolyte systems, one methanol with one molar $H_3PO_4$ plus 0.1 molar tetrabutyl ammonium bromide (labeled $H_3PO_4$) and the other with methanol with 0.23 molar $H_2SO_4$ (labeled $H_2SO_4$). The III-V semiconductor compound being etched was $Ga_xAl_{1-x}As$ with x equal to approximately 0.7 and the light source was a 1000 watt xenon lamp. The data plotted in the curve in FIG. 2 shows that the etching rate increases linearly with light intensity over a large range of light intensity but eventually saturates probably because of the formation of a passivating film on the surface being etched. This saturation effect occurs at different etch rates for different electrolyte systems and, in particular, at a higher etch rate for $H_2SO_4$ in methanol than for $H_3PO_4$ in methanol. Similar conclusions are obtained for other electrolyte systems.

Figure 3:
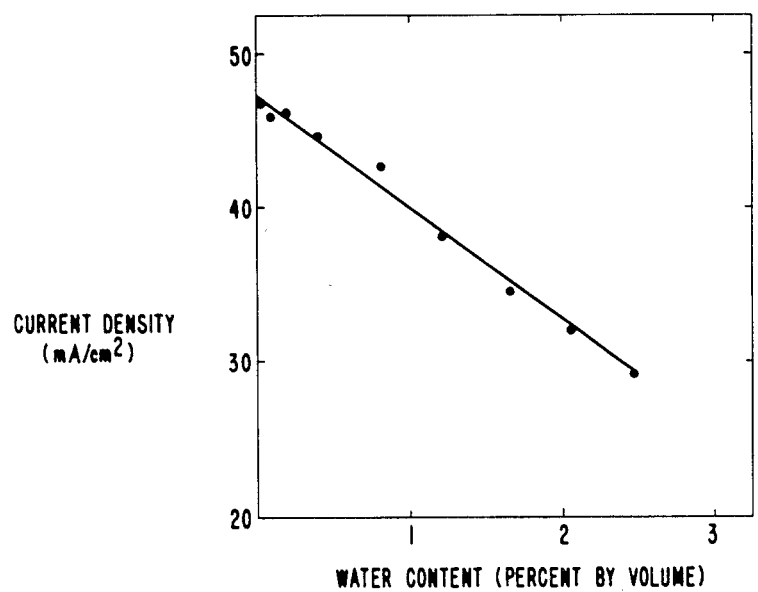
FIG. 3 shows a graph of etch rate vs. water content of the electrolyte system.

Water content of the electrolyte is also an important parameter in the practice of the invention. FIG. 3 shows etch rate as a function of water content for photoelectrochemically etching $Ga_{0.7}Al_{0.3}As$ in an electrolyte made up of 0.23 molar $H_2SO_4$ in methanol using a 250 watt quartz tungsten lamp. The data shown in FIG. 3 show decrease in etch rate (as measured by current density) with increased water content showing that minimum water content is preferred but that the etch process does work with water present.

An understanding of the invention is facilitated by a description of a particular application. This application involves separation of LED (light emitting diode) devices or chips from wafers containing a large number (about 100) of LED devices. A particular advantage of this process is that it produces narrow, straight-walled channels or slots which use up very little real estate on the wafer, permitting a larger number of devices on each wafer.

Figure 4:
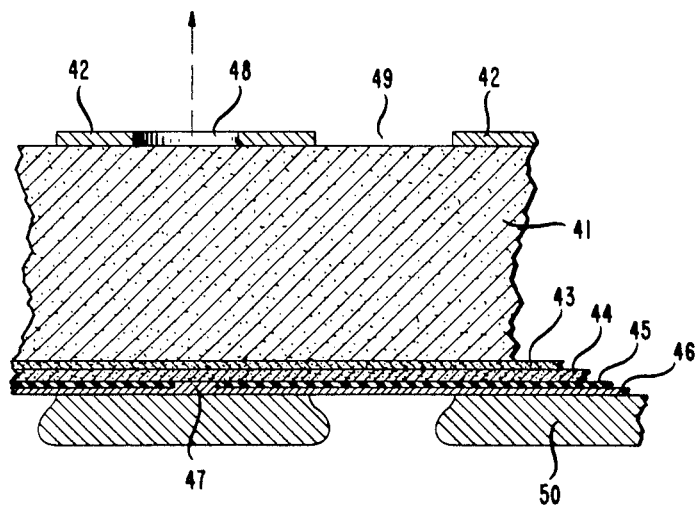
FIG. 4 shows a side view of part of a wafer containing LED devices which operate at about 0.87 $\mu$m.

As set forth above, each wafer is composed of a large number of chips or LED devices. FIG. 4 shows a side view of one LED in the wafer. This device emits at about 0.87$\mu$m. It is largely made up of a layer of n-$Ga_{0.7}Al_{0.3}As$ 41, generally about 30–50 $\mu$m thick with an n-type metal contact 42 generally about 2.8 $\mu$m thick. The n-type contact is generally a gold or gold-alloy metal and serves as the electrical contact in the photoelectrochemical etching process. Attached to the opposite surface of the main n-$Ga_{0.7}Al_{0.3}As$ layer 41 are two p-type layers, the first p-$Ga_{0.9}Al_{0.1}As$ 43 and the next p-$Ga_{0.7}Al_{0.1}As$ 44. The first layer 43 is generally about 0.5–1 $\mu$m thick and the second layer 44 is generally about 1–2 $\mu$m thick. Below the semiconductor layer 44 are two layers, an insulating layer 45 generally of $SiO_2$ with thickness of about 0.2 $\mu$m and a metallic layer 46 generally of gold alloy with thickness of about 0.2 $\mu$m. Current is injected through a small opening 47 in the insulating layer 45 so that light is emitted in an opening 48 in the n-contact 42, seen in this view. The photoelectrochemical etching takes place through another opening 49 in the n-contact and a light mask (not shown) is used to confine the radiation to this area. A heat sink 50 generally made of plated gold is also shown.

Etching is carried out through the opening 49 in the n-contact. The photoelectrochemical etch is used only on the n-type material and conventional, isotropic etch on the thin layers of p-type semiconductor, insulator and metal layers.

The photoelectrochemical etching was carried out using a 1000 watt Model 8066 Hg/Xe arc lamp made by Oriel Corporation and a PAR Model 173 potentiostat/-galvanostat equipped with a Model 172 digital coulometer and an EG and G PARC Model 175 Universal programmer. The electrochemical cells typically had a three electrode configuration with a Pt counter electrode and a saturated calomel reference electrode (SCE). Methanol with 0.25 molar $H_2SO_4$ was used as the electrolyte system. Etching through the GaAlAs layer usually takes about 15–30 minutes. The photoelectrochemical etching stops at the p-layer as evidenced by sharp reduction in current in the electrochemical electrical circuit. After etching through the n-layer, conventional etches are used for the p-layer, insulator and metal layer. Typical etches are as follows: for the p-layers; phosphoric acid, methanol and hydrogen peroxide; for the $SiO_2$ layer, aqueous HF; and for the gold layer, iodine in aqueous KI. These layers are sufficiently thin that undercutting or isotropic etching is not a problem.

What is claimed is:

1. A process for fabricating a device comprising n-type or semi-insulating III-V semiconductor compound comprising aluminum or indium comprising the step of photoelectrochemically etching the III-V semiconductor compound by passing current through the III-V semiconductor compound, electrolytic solution with electrical conductivity greater than 0.00001 mho/cm and anode in which the photoelectrochemical etching procedure further comprises:
  a. applying a potential to the semiconductor which is between the maximum potential of the valence band of the semiconductor in the electrolytic solution and the minimum potential of the conduction band of the semiconductor in the electrolytic solution;
  b. illuminating the part of the surface of the semiconductor to be etched with radiation of sufficient energy to produce holes in the valence band; characterized in that
  c. the electrolytic solution comprises nonaqueous solvent with less than 10 weight percent water.

2. The process of claim 1 in which the nonaqueous solvent comprises less than 5 weight percent water.

3. The process of claim 2 in which the nonaqueous solvent comprises less than one weight percent water.

4. The process of claim 1 in which the nonaqueous solvent comprises polar organic liquid.

5. The process of claim 4 in which the nonaqueous solvent comprises polar organic liquid selected from the group consisting of alcohols with up to 10 carbon atoms.

6. The process of claim 5 in which the liquid consists of methanol.

7. The process of claim 5 in which the liquid is acetonitrile.

8. The process of claim 1 in which the electrolytic solution comprises at least one substance to increase the conductivity of the electrolytic solution.

9. The process of claim 8 in which the substance is selected from the group consisting of HCl, $H_2SO_4$, phosphoric acid, HF, tetraalkyl ammonium salt with up to 24 carbon atoms and sodium alkoxide with up to 10 carbon atoms.

10. The process of claim 9 in which the tetraalkyl ammonium salt is tetrabutyl ammonium bromide.

11. The process of claim 9 in which the sodium alkoxide is sodium methoxide.

12. The process of claim 1 in which the III-V compound semiconductor is selected from the group consisting of AlGaAs, InAlAs, InGaAs, InGaAsP, InGaAlAs, AlGaAsSb, AlGaPSb, AlInPAs, AlInPSB and AlInAsSb.

13. The process of claim 12 in which the III-V compound semiconductor is AlGaAs.

14. The process of claim 13 in which the composition of the AlGaAs varies from $Al_{0.1}Ga_{0.9}As$ to $Al_{0.9}Ga_{0.1}As$.

15. The process of claim 14 in which the composition is approximately $Al_{0.3}Ga_{0.7}As$ and the potential is between $-0.7$ and $+0.5$ volts relative to a saturated calomel electrode and the electrolytic solution comprises methanol.

16. The device made in accordance with the process of claim 1.

17. The device of claim 16 in which the device is a light emitting diode.

* * * * *